(12) United States Patent
Kikuchi et al.

(10) Patent No.: US 8,928,485 B2
(45) Date of Patent: Jan. 6, 2015

(54) CHARGED CORPUSCULAR RAY APPARATUS

(75) Inventors: Hideki Kikuchi, Hitachinaka (JP); Isao Nagaoki, Hitachinaka (JP); Katsuyuki Minakawa, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 358 days.

(21) Appl. No.: 13/055,589

(22) PCT Filed: Jun. 15, 2009

(86) PCT No.: PCT/JP2009/061259
§ 371 (c)(1),
(2), (4) Date: Jan. 24, 2011

(87) PCT Pub. No.: WO2010/010771
PCT Pub. Date: Jan. 28, 2010

(65) Prior Publication Data
US 2011/0115637 A1    May 19, 2011

(30) Foreign Application Priority Data
Jul. 25, 2008 (JP) ................. 2008-191582

(51) Int. Cl.
*H01J 37/28* (2006.01)
*H01J 37/285* (2006.01)
(Continued)

(52) U.S. Cl.
CPC ............ *H01J 37/21* (2013.01); *H01J 37/20* (2013.01); *H01J 37/222* (2013.01);
(Continued)

(58) Field of Classification Search
CPC ...... A61B 6/032; A61B 6/4028; A61B 6/027; A61B 6/06; A61B 3/102; A61B 5/0073; A61B 6/4241; A61B 6/4021; A61B 2019/5236; A61B 6/035; A61B 8/13; A61B 8/483; A61B 2019/5238; A61B 2019/524

USPC ............ 340/600; 348/80; 250/307, 310, 311; 382/278, 144–151, 171, 172
See application file for complete search history.

(56) References Cited

U.S. PATENT DOCUMENTS 5,512,747 A * 4/1996 Maeda ........................ 250/310
5,911,003 A * 6/1999 Sones .......................... 382/162
(Continued)

FOREIGN PATENT DOCUMENTS

JP    07-176285    7/1995
JP    08-106873    4/1996
(Continued)

*Primary Examiner* — Daniel Wu
*Assistant Examiner* — John Bamert
(74) *Attorney, Agent, or Firm* — McDermott Will & Emery LLP

(57) ABSTRACT

The present invention relates to the acquisition of tilted series images of a minute sample in a short time.

The present invention relates to: measuring in advance the relation between an amount of focus shift and a degree of coincidence at the time of acquiring tilted series images; calculating backwards a focus shift from the degree of coincidence on the basis of this relation; correcting the focus shift by controlling a stage, an objective lens, and the like; and thus acquiring the tilted series images. In addition, the present invention relates to: acquiring a reference image in advance at the time of photographing the tilted series images; obtaining the correlation between an acquired image and the reference image; and performing, if the degree of coincidence is equal to or smaller than a set value, processing such as the transmission of a warning message and the stop of an image acquisition sequence. According to the present invention, it becomes possible to perform focusing at the time of photographing the tilted series images at high speed, so that the length of time for photographing the tilted series images can be shortened. In addition, an image inappropriate for three-dimensional reconstruction can be removed. This makes it possible to enhance the throughput of failure analysis of a semiconductor and an advanced material.

10 Claims, 11 Drawing Sheets

(51) Int. Cl.
*H01J 37/21* (2006.01)
*H01J 37/20* (2006.01)
*H01J 37/22* (2006.01)

(52) U.S. Cl.
CPC ...... *H01J 37/28* (2013.01); *H01J 2237/20207* (2013.01); *H01J 2237/226* (2013.01); *H01J 2237/31749* (2013.01)
USPC ........... 340/600; 382/144; 382/145; 382/146; 382/147; 382/148; 382/149; 382/150; 382/151; 382/171; 382/272; 382/278; 250/307; 250/310; 250/311

(56) References Cited

U.S. PATENT DOCUMENTS 7,138,629 B2 * 11/2006 Noji et al. .................. 250/311
2005/0029452 A1 * 2/2005 Furukawa et al. ............ 250/311

FOREIGN PATENT DOCUMENTS

JP 2004-087214 3/2004
JP 2005-019218 1/2005

* cited by examiner

CHARGED CORPUSCULAR RAY APPARATUS

RELATED APPLICATIONS

This application is the U.S. National Phase under 35 U.S.C. §371 of International Application No. PCT/JP2009/061259, filed on Jun. 15, 2009, which in turn claims the benefit of Japanese Application No. 2008-191582, filed on Jul. 25, 2008, the disclosures of which Applications are incorporated by reference herein.

TECHNICAL FIELD

The present invention relates to the acquisition of tilted series images in a charged particle beam apparatus.

BACKGROUND ART

There is a growing need to carry out the three-dimensional reconstruction of a sample such as a semiconductor or an advanced material by using a charged particle beam apparatus, in particular, a transmission electron microscope (TEM), to thereby perform failure analysis on the basis of the three-dimensional structure of the sample. In order to carry out the three-dimensional reconstruction, a series of images which is photographed by tilting the sample in steps of a few degrees (tilted series images) is required. The sample used at this time has a size of approximately 1 μm and has a pillar-like shape in many cases.

Patent Literature 1 (JP Patent Publication (Kokai) No. 2004-87214 A) discloses that a pillar-like sample is mounted on a 360-degree rotatable pillar holder, and is observed at several 10,000-fold magnification or higher.

In addition, Patent Literature 2 (JP Patent Publication (Kokai) No. 07-176285 A (1995)) discloses focus correction based on a degree of sharpness.

CITATION LIST

Patent Literatures

Patent Literature 1: JP Patent Publication (Kokai) No. 2004-87214 A
Patent Literature 2: JP Patent Publication (Kokai) No. 07-176285 A (1995)

SUMMARY OF INVENTION

Technical Problems

As a result of intensive studies on the acquisition of tilted series images by the inventors of the present application, the following findings were obtained.

Normally, the mechanical rotation accuracy of a stage or a sample holder on which a sample is mounted is in the order of ten μm. For this reason, for example, when a sample having a size of approximately 1 μm is mounted on the pillar holder of Patent Literature 1 to be rotated, the sample is eccentrically rotated as illustrated in FIG. 1. In the case of photographing the tilted series images, the sample is moved to the center of the field of view at a given angle, the image is photographed after focusing, and then the sample is tilted in desired angle steps of a few degrees. However, this rotation is a motion with the eccentricity as described above, and hence the sample is brought by the rotation out of the observation field of view. Therefore, an operator is required to operate the stage to thereby move the sample to the center of the observation field of view. In addition, the eccentricity brings about a focus shift, and hence the operator needs to perform focusing.

In the case where the tilted series images are automatically photographed by using the technology disclosed in Patent Literature 2, it is necessary to photograph approximately 10 images for each tilt angle. Further, in the case of the automatic photographing, all the photographed images are not necessarily usable for carrying out three-dimensional reconstruction. That is, depending on the image processing accuracy adopted at the time of the automatic photographing or the mechanical accuracy at the time of tilting the sample, the sample may not be on the photographed image or an image which is considerably out of focus may exist. If such images are used for the three-dimensional reconstruction without any change, a fake image is generated in the reconstructed image. For this reason, the operator is required to check the photographed images one by one, select an image inappropriate for the three-dimensional reconstruction, and take the inappropriate image again. Accordingly, it requires an immense amount of time to photograph all the series images for carrying out the three-dimensional reconstruction.

In addition, there also arises a problem that contaminations are attached to a surface of the sample by radiating a charged particle beam to the sample for a long time.

The present invention relates to the acquisition of tilted series images of a minute sample in a short time.

Solution to Problems

The present invention relates to: measuring in advance the relation between an amount of focus shift and a degree of coincidence at the time of acquiring tilted series images; calculating backwards a focus shift from the degree of coincidence on the basis of this relation; correcting the focus shift by controlling a stage, an objective lens, and the like; and thus acquiring the tilted series images.

In addition, the present invention relates to: acquiring a reference image in advance at the time of photographing the tilted series images; obtaining the correlation between an acquired image and the reference image; and performing, if the degree of coincidence is equal to or smaller than a set value, processing such as the transmission of a warning message and the stop of an image acquisition sequence.

Advantageous Effects of Invention

According to the present invention, it becomes possible to perform focusing at the time of photographing the tilted series images at high speed, so that the length of time for photographing the tilted series images can be shortened. In addition, an image inappropriate for three-dimensional reconstruction can be removed. This makes it possible to enhance the throughput of failure analysis of a semiconductor and an advanced material.

DESCRIPTION OF EMBODIMENTS

Figure 1:
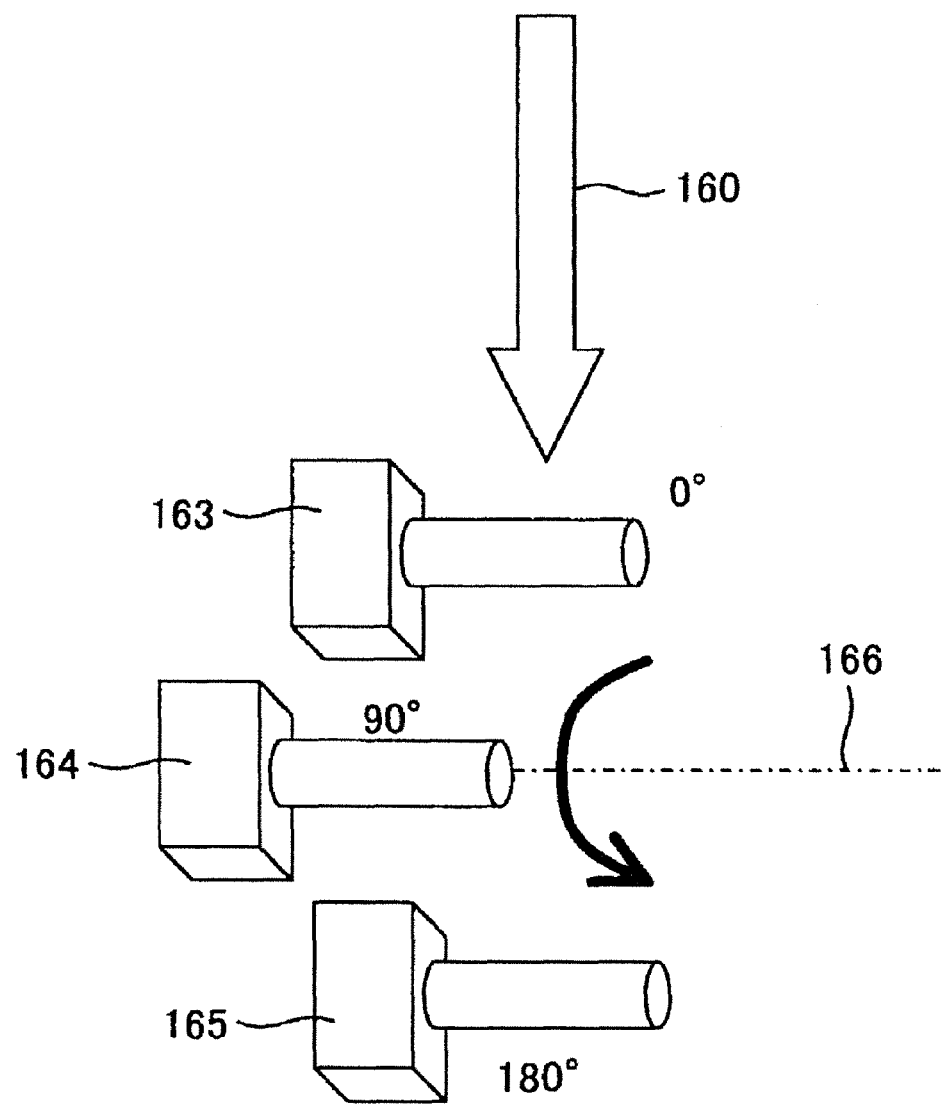
FIG. 1 illustrates a rotational motion of a sample with eccentricity.

In embodiments, there is disclosed a charged particle beam apparatus including: a sample pedestal which rotatably holds a sample; a radiation optical system which radiates a charged particle beam to the sample; a detector which detects a charged particle beam which has been transmitted through the sample or secondary electrons which are generated from the sample by the charged particle beam; a sample pedestal control device which controls at least a rotation angle of the sample pedestal; and an arithmetic device which controls at least the radiation optical system or the sample pedestal control device, the charged particle beam apparatus correcting disappearance from a field of view by using a relation between an amount of focus shift and a degree of coincidence which is obtained in advance, to thereby automatically photograph tilted series images.

In addition, in the embodiments, there is disclosed a charged particle beam apparatus including: a sample pedestal which rotatably holds a sample; a radiation optical system which radiates a charged particle beam to the sample; a detector which detects a charged particle beam which has been transmitted through the sample or secondary electrons which are generated from the sample by the charged particle beam; a sample pedestal control device which controls at least a rotation angle of the sample pedestal; and an arithmetic device which controls at least the radiation optical system or the sample pedestal control device, the charged particle beam apparatus correcting a focal point by using a relation between an amount of focus shift and a degree of coincidence which is obtained in advance, to thereby automatically photograph tilted series images.

In addition, in the embodiments, there is disclosed a charged particle beam apparatus, in which the arithmetic device includes: means for registering, as a template, image data of the sample or part of the data thereof; and means for acquiring at least two pieces of image data, and calculating image correlation between one image used as the template and another image, to thereby calculate a degree of coincidence.

In addition, in the embodiments, there is disclosed a charged particle beam apparatus, in which the arithmetic device includes: means for calculating image correlation between each of the photographed tilted series images and the image used as the template, to thereby calculate a degree of coincidence; means for setting a threshold value of the degree of coincidence; and means for highlight-displaying an image having the degree of coincidence equal to or smaller than the threshold value, among the tilted series images.

In addition, in the embodiments, there is disclosed a charged particle beam apparatus, in which the arithmetic device includes: means for calculating image correlation between each of the photographed tilted series images and the image used as the template, to thereby calculate a degree of coincidence; means for setting a threshold value of the degree of coincidence; and means for stopping radiation of the charged particle beam to the sample when an image having the degree of coincidence equal to or smaller than the threshold value, among the tilted series images, is photographed.

In addition, in the embodiments, there is disclosed a charged particle beam apparatus, in which the arithmetic device includes means for issuing a warning display when the radiation of the charged particle beam is stopped.

Hereinafter, the above-mentioned and other novel features and effects of the invention of the present application are described with reference to the drawings. It should be noted that the drawings are used for the understanding of the present invention, and thus do not restrict the scope of the claims.

Embodiment 1

In the present embodiment, at the time of automatically acquiring tilted series images necessary for three-dimensional reconstruction, the relation between an amount of focus shift and a degree of coincidence is measured in advance, the amount of focus shift is calculated backwards from the degree of coincidence on the basis of this relation, and a focus shift is corrected by controlling a height of a stage or a current value of an objective lens.

In addition, in the present embodiment, at the time of photographing the tilted series images, an operator acquires a reference image in advance, the correlation between an automatically acquired image and the reference image is automatically obtained, and if the degree of coincidence is equal to or smaller than a set value, a warning message is transmitted or an automatic image acquisition sequence is stopped. Otherwise, the operator is informed of an image having a degree of coincidence equal to or smaller than the set value, among the automatically photographed tilted series images.

(1) Apparatus Configuration

Figure 2:
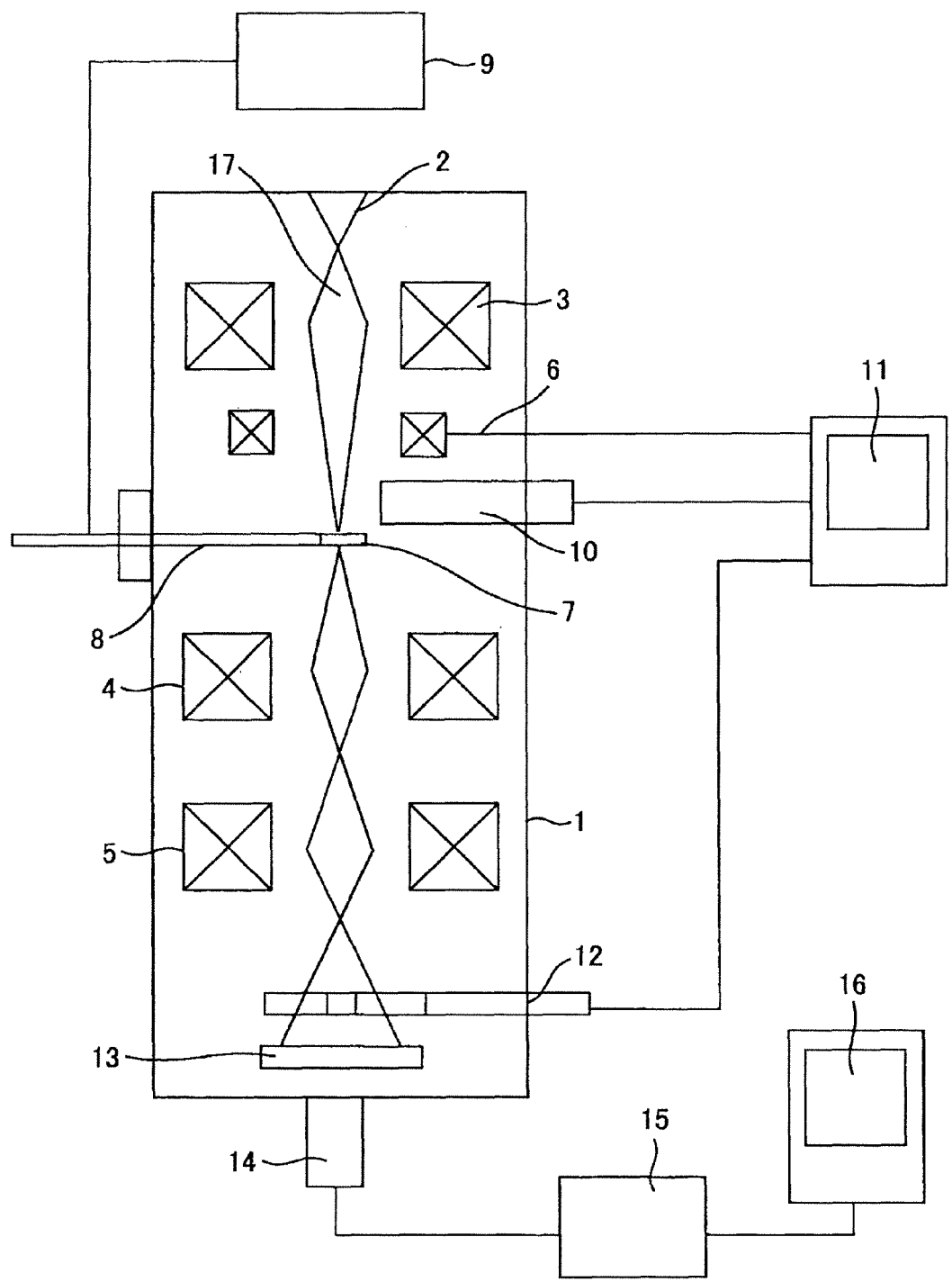
FIG. 2 is a view illustrating a basic configuration of a transmission electron microscope.

FIG. 2 is a view illustrating a basic configuration of a transmission electron microscope (hereinafter, abbreviated to TEM) body 1. The TEM body 1 includes an electron gun 2, a radiation lens 3, an objective lens 4, and a projection lens 5. A scanning coil 6 is placed between the radiation lens 3 and the objective lens 4, and a sample 7 is inserted below the scanning coil 6. The sample 7 is attached to a sample holder 8, and the sample holder 8 is connected to a holder control unit 9. A secondary electron detector 10 is incorporated above the sample 7 and below the scanning coil 6. The secondary electron detector 10 is connected to a scanned image display device 11. A circular ring-like detector 12 for dark-field STEM image observation is placed below the projection lens 5. The circular ring-like detector 12 is connected to the scanned image display device 11. In addition, a detector 13 (for bright-field STEM image observation) which can be taken into and out of an electron beam axis is provided below the circular ring-like detector 12, and is connected to the scanned image display device 11. A TV camera 14 for transmission image observation is placed below the detector 13. The TV camera 14 is connected to a TV monitor 16 via a TV camera control unit 15.

An electron beam 17 is converged by the radiation lens 3 at a spot on a surface of the sample, and the surface of the sample 7 is scanned therewith by the scanning coil 6. The secondary electron detector 10 detects secondary electrons which are emitted from the sample 7 by the radiation of the electron beam 17, and the scanned image display device 11 displays a secondary electron image of the scanned region of the sample 7 with the electron beam 17. The detector 13 detects transmission electrons which are scattered within a range in which the angle from the sample 7 is a half angle of about 50 mrad, and the scanned image display device 11 displays a bright-field transmission electron image. Similarly, the circular ring-like detector 12 detects electrons (elastically-scattered electrons) which are scattered by the radiation of the electron beam 17 within a range in which the scattering angle from the sample 7 is a half angle of about 80 to 500 mrad, and the scanned image display device 11 displays a dark-field transmission electron image. In addition, the electron beam 17 having a given divergence is radiated to the surface of the sample 7 by changing conditions of the radiation lens 3, the electrons which have been transmitted through the sample 7 are imaged by the objective lens 4, and the formed image is enlarged by the projection lens 5 to be projected on the TV camera 14. The projected transmission electron image is displayed on the TV monitor 16 via the TV camera control unit 15. The angle of the sample 7 can be changed on the optical axis of the electron beam by the holder control unit 9 connected to the sample holder 8, and hence a secondary electron image, a scanning transmission image, and a transmission electron image can be observed at various angles.

Figure 3:
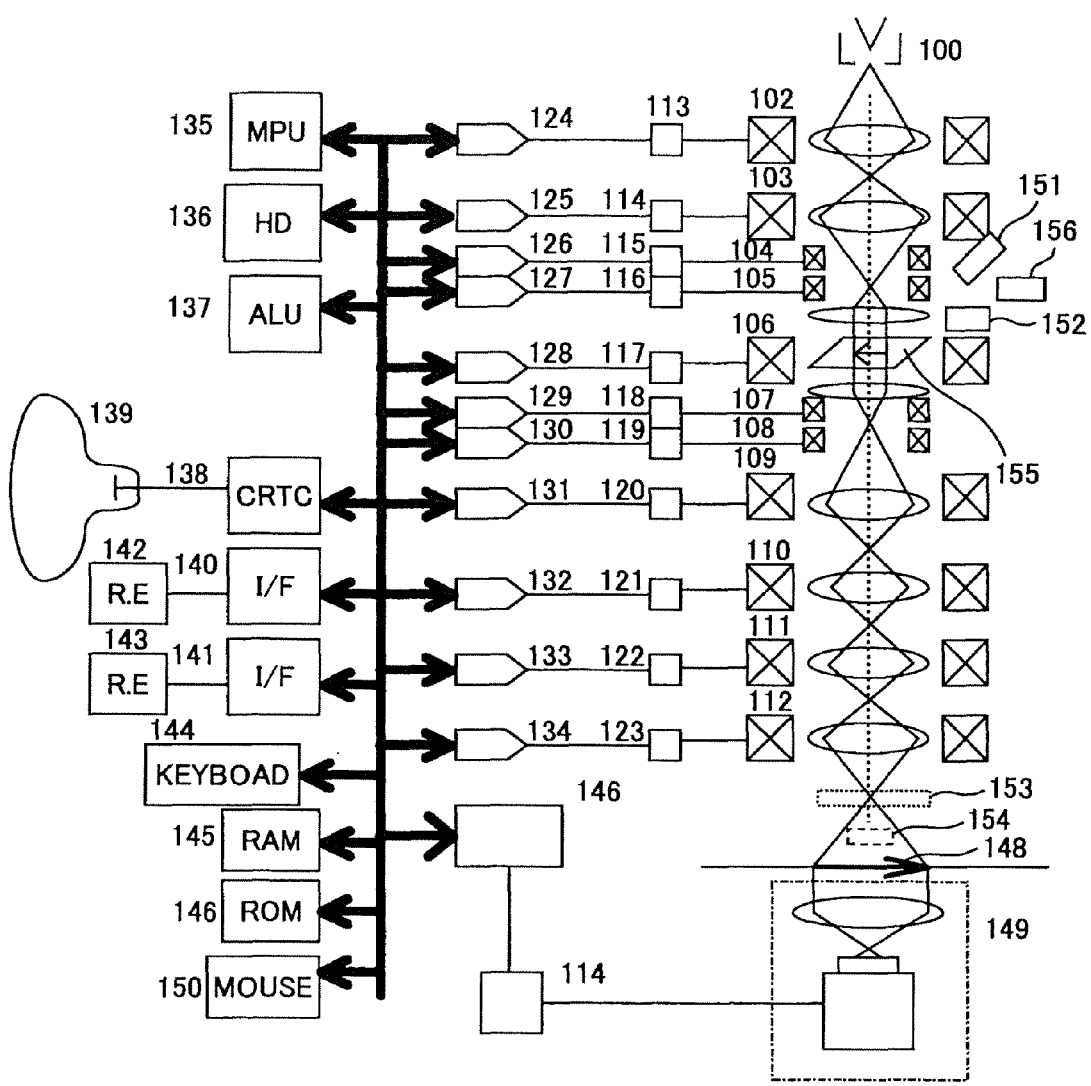
FIG. 3 is a schematic view illustrating a control system of the transmission electron microscope.

FIG. 3 is a schematic view illustrating a control system of the transmission electron microscope. As illustrated in FIG. 3, data on lens systems is outputted from a ROM 146 which stores therein lens data for transmission image observation, to respective DACs 124, 125, 128, and 131 to 134 to be converted into analog signals. The analog signals are outputted from the respective DACs 124, 125, 128, and 131 to 134 to excitation power supplies 113, 114, 117, and 120 to 123, to thereby cause lens coils 102, 103, 106, and 109 to 112 of the respective lens systems to output current. A charged particle beam is deflected and converged by these lens systems to be radiated to the sample. Signals of a particle beam which has been transmitted through the sample or secondary electrons generated on the surface of the sample are detected by detectors (a TV 149 and a secondary electron detector 151) to be transmitted to a TV control unit, and the image thereof is displayed on the TV. The displayed image is stored in a ROM or a RAM.

(2) Sample Holder (Stage)

Figure 4:
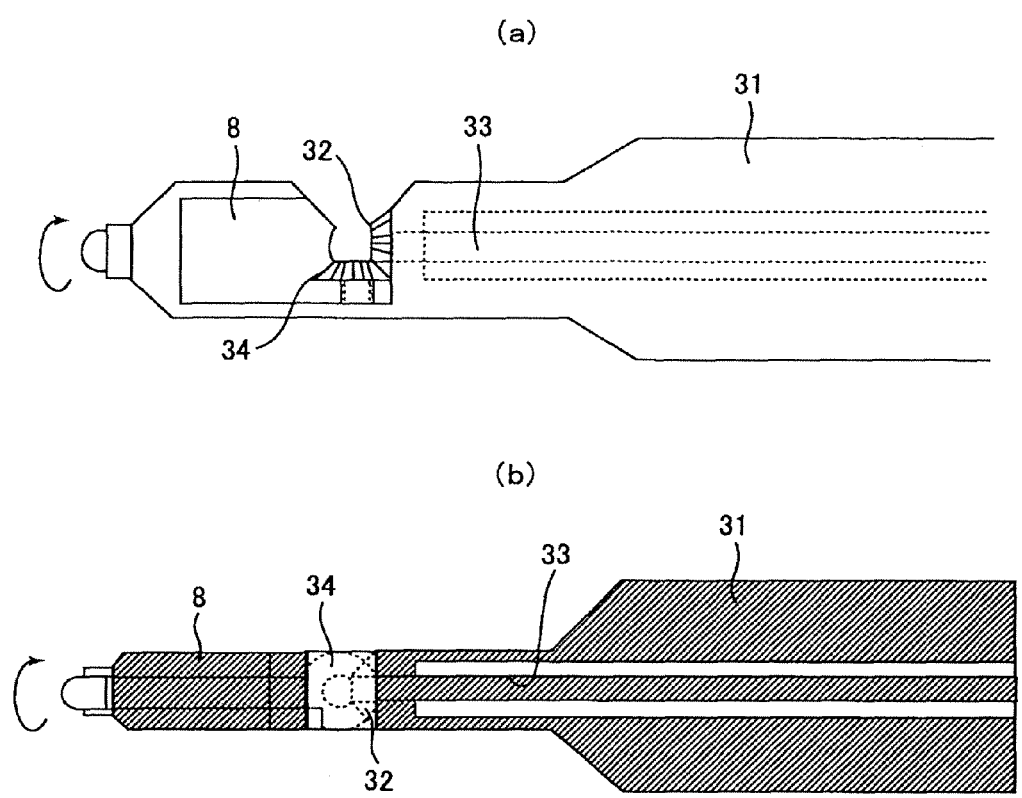
FIG. 4 are schematic views each illustrating a sample holder.

FIGS. 4(a) and 4(b) are a top view and a cross sectional view illustrating a leading end part of the sample holder 8 for the charged particle beam apparatus, respectively. In the sample holder 8, a holder shaft 31 coupled to the leading end part includes a mechanism which can be rotated at 360° about its shaft center, and another rotating shaft 33 including a bevel gear 32 (first bevel gear) at its leading end part is further provided inside of the holder shaft 31 independently of the mechanism. The sample rotating shaft 33 is connected to the holder control unit 9, and the sample rotating shaft 33 and the bevel gear 32 are rotated by the holder control unit 9. The bevel gear 32 and a bevel gear 34 (second bevel gear) are in contact with each other so as to mesh with each other. Therefore, when the sample rotating shaft 33 is rotated, the bevel gear 32 is rotated, and at the same time, the bevel gear 34 is also rotated. In addition, a part of the sample holder 8 is opened in order to prevent structural members of the sample holder 8 from blocking an ion beam when the ion beam enters within an FIB apparatus.

Figure 5:
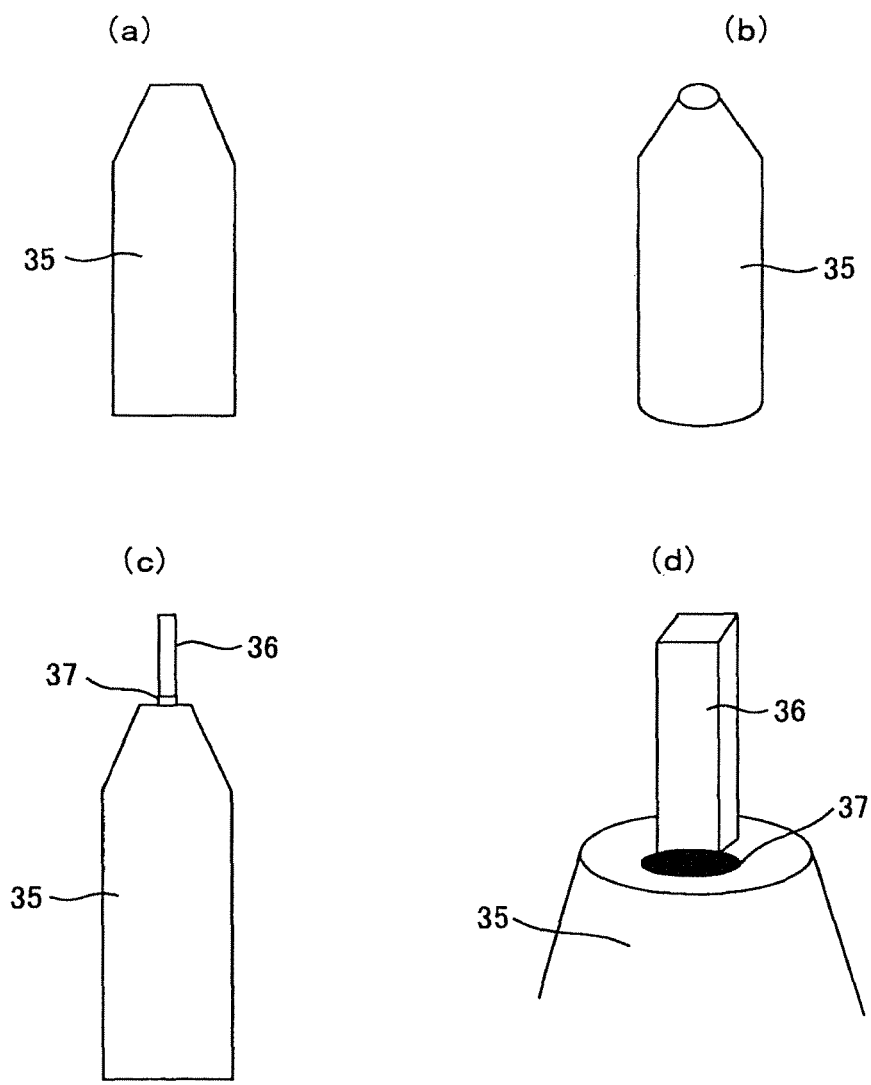
FIG. 5 are schematic views each illustrating a sample pedestal.

FIGS. 5(a) and 5(b) are a side view and a perspective view illustrating a sample pedestal 35, respectively. FIGS. 5(c) and 5(d) are a side view and a perspective view illustrating a state where a minute sample piece 36 is fixed to the sample pedestal 35, respectively. The minute sample piece 36 is attached to a leading end of the sample pedestal 35. The leading end part of the sample pedestal 35 has a flat shape so as to facilitate the fixation of the minute sample piece 36. A deposition film 37 is formed at a contact portion between the minute sample piece 36 and the sample pedestal 35 by using an FIB, to thereby bond the minute sample piece 36 and the sample pedestal 35 to each other.

FIG. 5(a) illustrates an example in which the sample pedestal 35 (sample support part) is fixed to the sample holder 8 for the charged particle beam apparatus. The bevel gears 32 and 34 are hollow, and hence the sample pedestal 35 can be fitted thereto by insertion. At the time of machining by an FIB, the sample pedestal 35 is fitted to the bevel gear 34, the sample holder 8 is inserted to the FIB apparatus, and the ion beam is caused to enter from above the sample pedestal 35, to thereby machine the minute sample piece 36. When the sample pedestal 35 is rotated with the ion beam being converged at a spot, the cylindrical minute sample piece 36 can be machined.

When the machining by an FIB has been finished, the holder shaft 31 itself is rotated by 90°, the sample holder 8 is inserted in a sample chamber of the transmission electron microscope 1, and the electron beam 17 is caused to enter a side surface of the sample pedestal 35. That is, the electron beam 17 is caused to enter in the direction perpendicular to the plane of the drawings, and the transmission image is observed. At this time, the bevel gear 34 is rotated by moving the sample rotating shaft 33, whereby the minute sample piece 36 can be observed in a 360-degree direction. The rotation angle of the minute sample piece 36 can be controlled by causing the holder control unit 9 to drive the sample rotating shaft 33. In addition, the holder control unit 9 can also finely adjust the sample holder 8 in X, Y, and Z directions.

It should be noted that, in the present embodiment, the sample holder is finely adjusted by the holder control unit 9 in the X, Y, and Z directions, and alternatively, the holder may be placed on a stage which can finely move in the X, Y, and Z directions.

(3) Means for Calculating an Amount of Displacement by Phase-Only Correlation

An image obtained by cutting out a part of a transmission image is recorded in a storage device as f1 (m, n) as a registered image at a pixel count of M×N as a transmission image. Next, an image taken in after a recording mode is recorded in the storage device as f2 (m, n) as a reference image at a pixel count of M×N.

It should be noted that both of the images are natural images, m=0, 1, 2, ... M−1, and n=0, 1, 2, ... N−1.

Discrete Fourier images F1 (m, n) and F2 (m, n) of f1 (m, n) and f2 (m, n) are defined respectively by (1) and (2) as follows.

$$F1(u,v)=A(u,v)ej\theta(u,v) \quad (1)$$

$$F2(u,v)=B(u,v)ej\phi(u,v) \quad (2)$$

where u=0, 1, 2, ... M−1, and v=0, 1, 2, ... N−1, and where A (u, v) and B (u, v) denote amplitude spectra, and θ (u, v) and φ (u, v) denote phase spectra.

In the phase correlation, if there is an image parallel displacement between two images, the peak position of the correlation is shifted by the amount of displacement.

A method of deriving the amount of displacement is described below.

First, assuming that an original image f2 (m, n) is displaced by r' in the x direction, f4 (m, n)=f2 (m+r', n).

Expression (2) is transformed into Expression (3) as follows.

$$F4(u,v)=\Sigma\Sigma f2(m+r',n)e-j2\pi(mu/M+nv/N)=B(u,v)ej(\phi+2\pi r'u/M) \quad (3)$$

When the amplitude spectrum B (u, v) is set as a constant, a phase image which does not depend on the contrast of the image is obtained. A phase image F'4 (u, v) of f4 is defined by Expression (4) as follows.

$$F'4(u,v)=ej(\phi+2\pi r'u/M) \quad (4)$$

When a phase image F'1 (u, v) is multiplied by the complex conjugate of F'2 (u, v), a composite image H14 (u, v) is defined by Expression (5) as follows.

$$H14(u,v)=F'1(u,v)(F'2(u,v))^*=ej(\theta-\phi-2\pi ru/M) \quad (5)$$

When the composite image H14 (u, v) is subjected to inverse Fourier transform, a correlation strength image G14 (r, s) is defined by Expression (6) as follows.

$$G14(r,s)=\Sigma\Sigma(H14(u,v))ej2\pi(ur/M+us/N)=\Sigma\Sigma(ej(\theta-\phi-2\pi r'u/M))ej2\pi(ur/M+us/N)=G12(r-r') \quad (6)$$

According to Expression (6), if there is an amount of position shift r' in the X direction between two images, the peak position of the correlation strength image is shifted by -r'. In addition, because the correlation is calculated on the basis of phase components, even if the two images are different in brightness or contrast, the amount of displacement can be calculated. If there is an amount of position shift in the X direction between the two images, the peak appears at a position of ΔG (pixel) with respect to the center of the correlation strength image. For example, if there is a shift of 2 pixels in the X direction between the two images, the composite image has two-cycle waves. When this composite image is subjected to inverse Fourier transform, the correlation strength image is obtained, and the peak appears at a position shifted by 2 pixels from the center. This ΔG (pixel) corresponds to an amount of displacement on a light receiving surface of the detector, and ΔG is transformed into an amount of displacement Δx on the surface of the sample. Assuming that a diameter of the light receiving surface of the detector is L, a magnification of the transmission electron microscope on the light receiving surface is M, and a pixel count of the light receiving surface of the detector is Lm, Expression (7) is obtained as follows.

$$\Delta x=\Delta G(\text{pixel})\times L/Lm(\text{pixel})/M \quad (7)$$

Δx denotes the amount of displacement on the surface of the sample between the two images.

In addition, in a scanning electron microscope which detects secondary electrons or transmission electrons by scanning with a charged particle beam to thereby display an image, a scan width D on the surface of the sample and a resolution R (pixel) of a photographed image are used to calculate as follows.

$$\Delta x=\Delta G(\text{pixel})\times D/R \quad (8)$$

(4) Means for Calculating a Degree of Coincidence

Next, an amount of displacement between images, a magnification, and the accuracy of a rotation angle are described. Only a mathematical phase is used in the correlation calculation using only phase components, and hence the peak which appears in the correlation strength is a δ peak. For example, if there is a shift of 1.5 pixels between two images, the composite image has 1.5-cycle waves. When this composite image is subjected to inverse Fourier transform, a δ peak appears at a position shifted by 1.5 pixels from the center of the correlation strength image. Then, because a $1.5^{th}$ pixel does not exist, a value of the δ peak is distributed to the $1^{st}$ pixel and the $2^{nd}$ pixel. Here, the median point of a pixel having a higher degree of coincidence is obtained, and an actual δ peak position is calculated on the basis of this distributed value, whereby the calculation result with the accuracy of approximately 1/10 of a pixel can be obtained. In addition, because the correlation strength image is the δ peak, the evaluation of the similarity between the two images is performed on the basis of the peak height of the correlation strength image. Assuming that the image is f1 (m, n) and the peak height is Peak (pixel), the degree of coincidence (%) is defined by Expression (9) as follows.

$$\text{Degree of coincidence (\%)}=(\text{Peak})/(m\times n)\times 100 \quad (9)$$

For example, in the case where the processing pixel count is 128 pixels×128 pixels and Peak is 16,384 (pixels), the degree of coincidence=(16,384)/(128×128)×100=100(%).

(5) Automatic Photographing of Tilted Series Images

Figure 6:
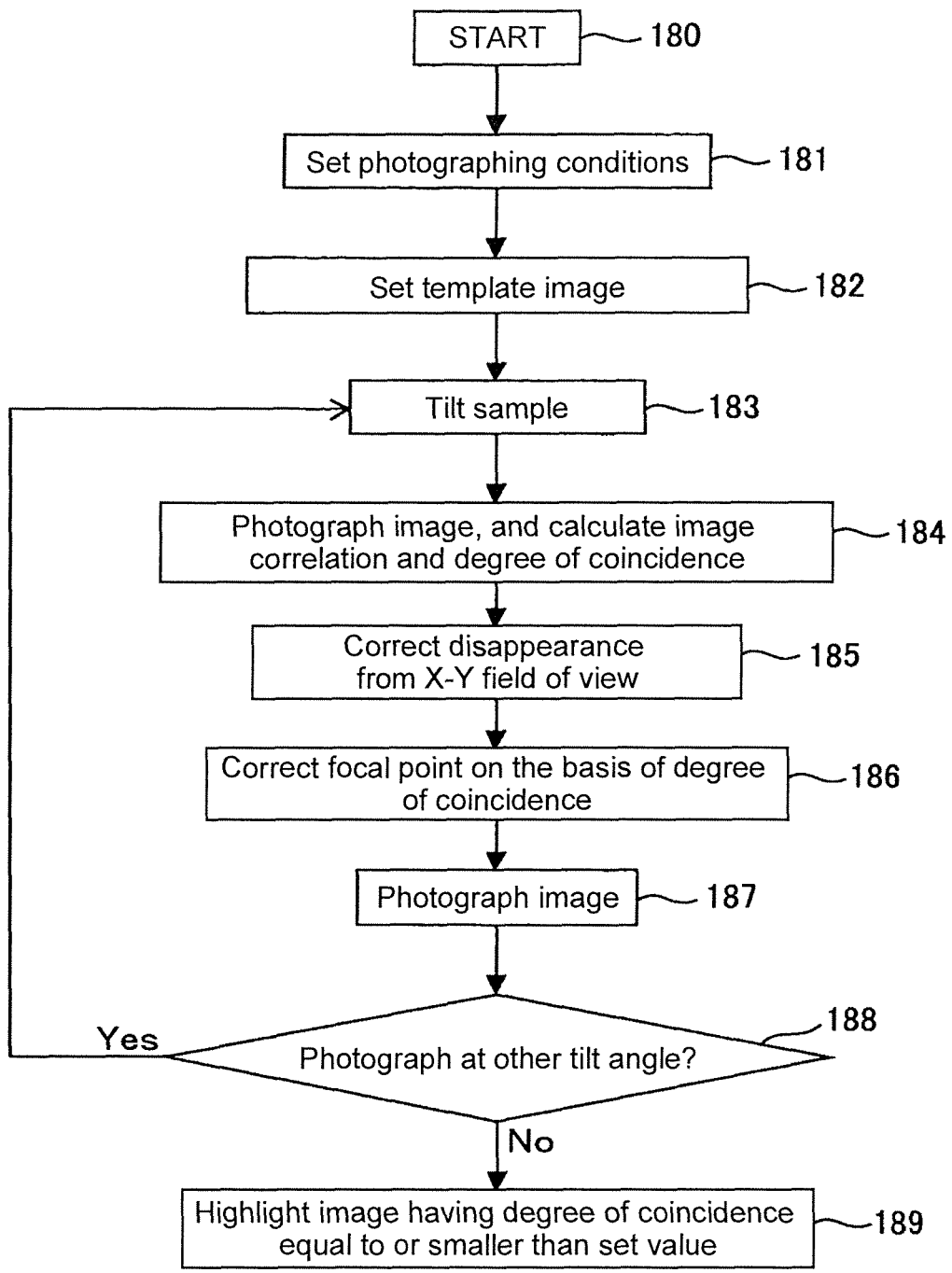
FIG. 6 is a flow chart showing Embodiment 1.
Figure 7:
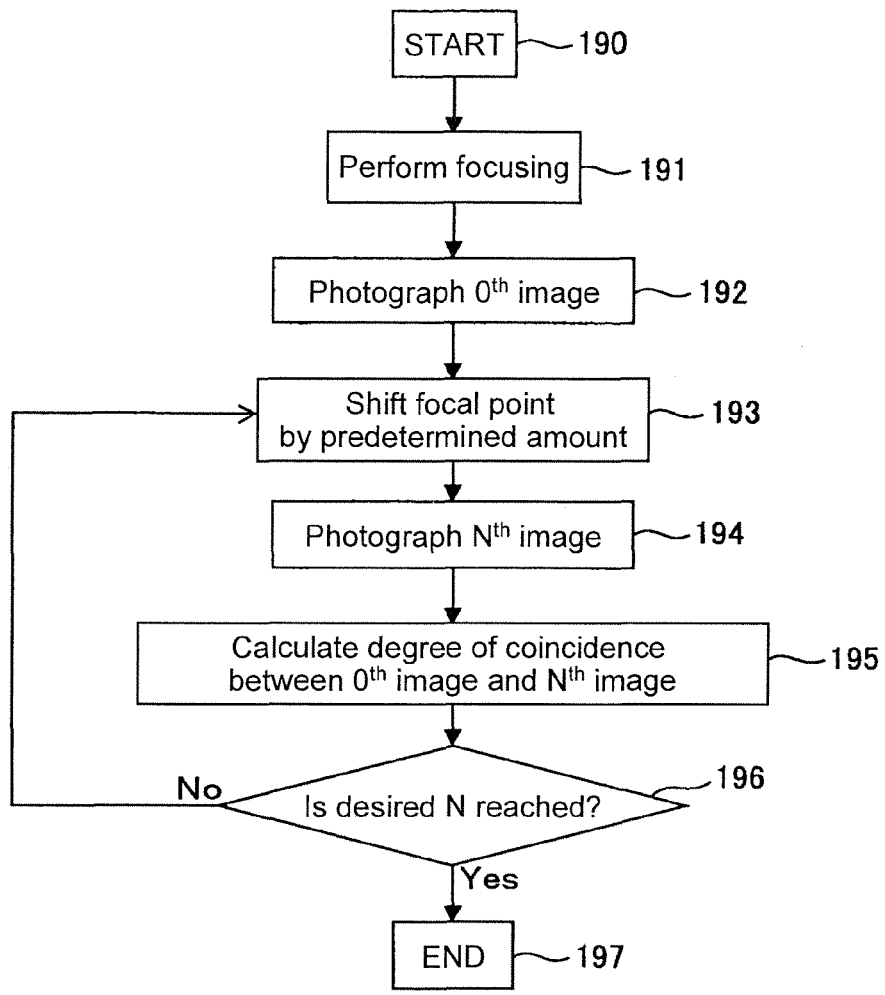
FIG. 7 is a flow chart showing Embodiment 1.
Figure 8:
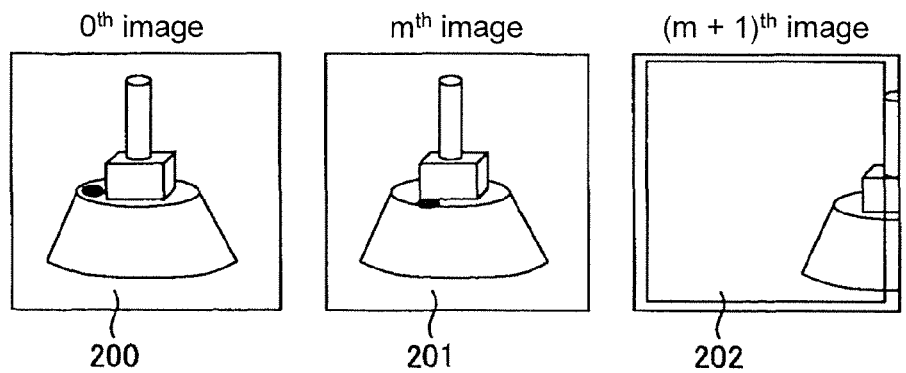
FIG. 8 illustrates the display of a list of photographed images.

With reference to FIG. 6 to FIG. 8, the flow of automatic photographing of tilted series images is described.

When the automatic photographing of the tilted series images is performed, a tilt step angle t and the number of photographed images n are first set. In order to minimize virtual images generated in a three-dimensionally reconstructed image, images are photographed in steps of 1° to 5° within a tilt angle range of ±90°, and hence the number of photographed images is set to 37 to 181.

Figure 9:
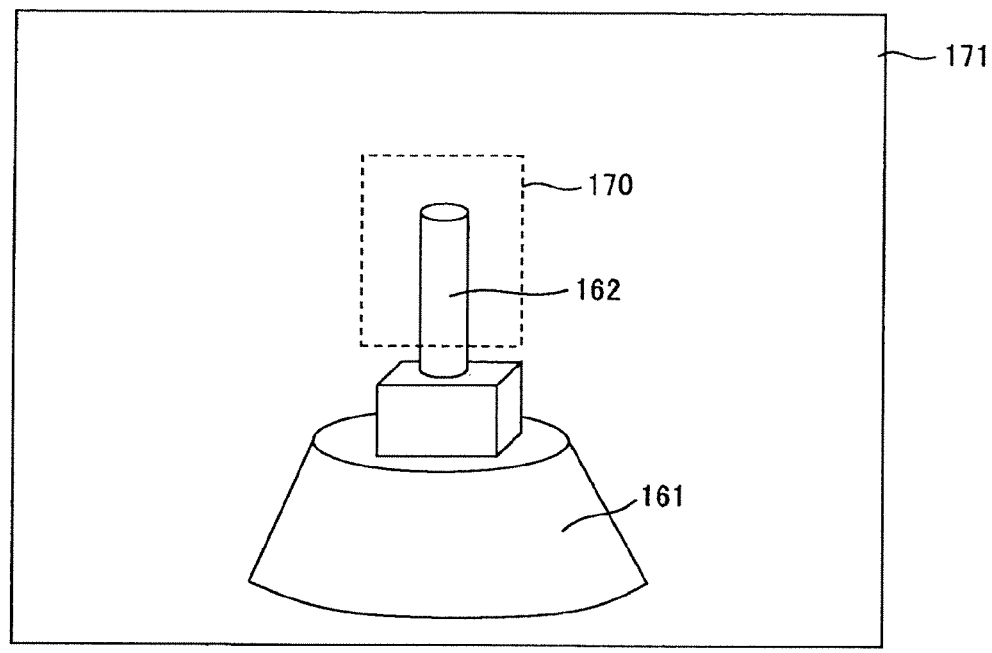
FIG. 9 illustrates a template registration screen.

Next, an electron optical system or a sample stage 52 is adjusted so that the sample comes into focus and is positioned at the center of the field of view, and then the image is photographed. A region which becomes a template is set from this reference image, and is used in the subsequent steps. The template is set by specifying a region by an operator as illustrated in FIG. 9.

After the settings as described above have been made, the automatic photographing of the tilted series images is started. The first image has already been adjusted, and thus is acquired without any change. After that, the sample is tilted by a desired angle. When the sample is tilted, disappearance from the field of view as well as a focus shift occurs due to a problem of the mechanical accuracy of a tilt mechanism. With regard to the disappearance from the field of view, after the image acquisition, the amount of displacement is calculated by the template and the above-mentioned means for calculating an amount of displacement (184), and the calculation result may be fed back to the stage and a deflector for correction (185). With regard to the focus shift, after the tilting of the sample and the correction of the disappearance from the field of view, the image is acquired, and the image correlation between the acquired image and the first image is performed. At the time of the comparison therebetween, the degree of coincidence is calculated by using the above-mentioned means for calculating a degree of coincidence. The degree of coincidence and the height of the sample to be corrected are obtained in advance, and hence a command about a correction amount according to the degree of coincidence may be given to the sample stage. In the case where focus correction is performed on the basis of the degree of coincidence, when a transmission image is used, how the sample looks changes depending on the tilt angle in accordance with an internal structure of the sample. Therefore, when a secondary electron image is used, correction with higher accuracy can be performed.

Figure 10:
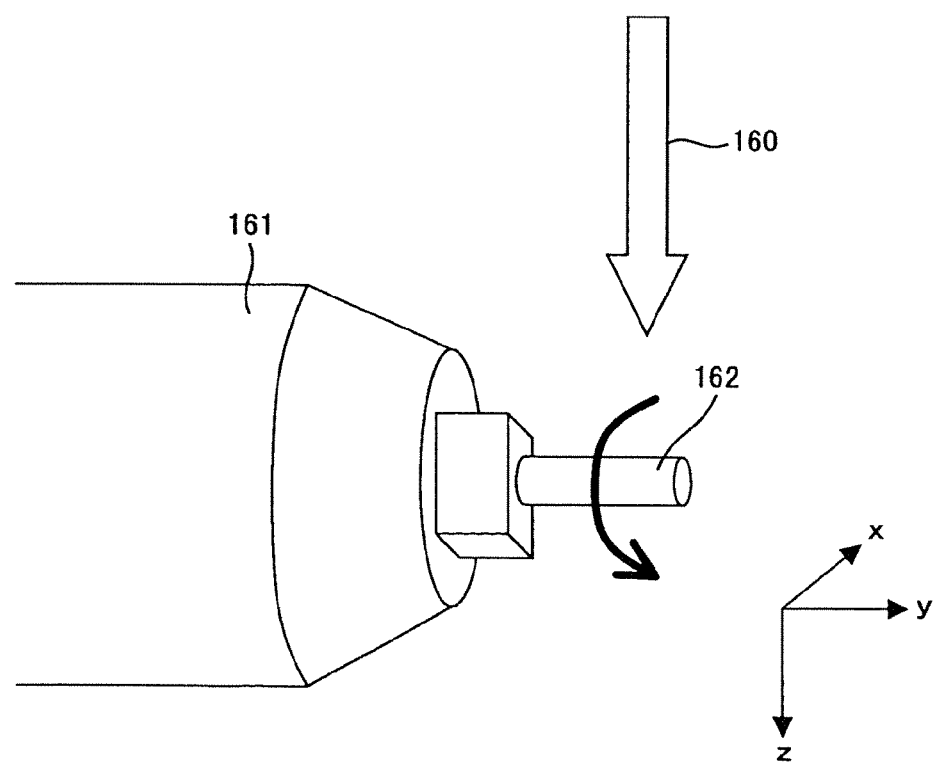
FIG. 10 illustrates a columnar needle stage.

In addition, when a columnar needle stage as illustrated in FIG. 10 on which a width and the like of the sample do not change depending on the tilt angle of the sample is used, correction with higher accuracy is possible.

(6) Means for Correcting a Focus Shift

With reference to the flow chart of FIG. 7, means for correcting a focus shift is described. First, an in-focus image ($0^{th}$ image) is photographed (192). As illustrated in FIG. 9, a region which becomes a template is selected from this photographed image. Next, the height of the sample is changed by approximately several μm to shift a focal point, and the next image (1$^{st}$ image) is photographed (193, 194). The correlation between the 0$^{th}$ image and the 1$^{st}$ image is obtained, to thereby obtain and record the degree of coincidence (195).

Subsequently, the height of the sample is sequentially changed to photograph an image, and the degree of coincidence between the photographed image and the 0$^{th}$ image is calculated. When a desired N is reached, the processing is ended (197).

Figure 11:
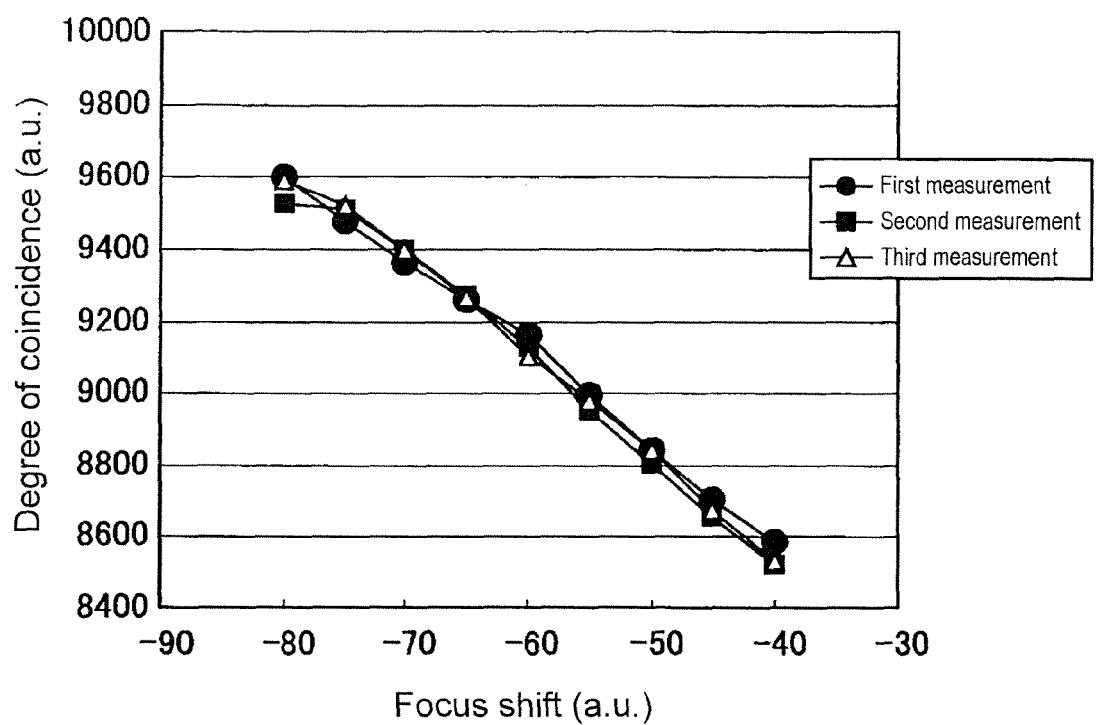
FIG. 11 shows the relation between a degree of coincidence and a height of the sample.

The relation between the degree of coincidence and the height of the sample which is obtained as described above is shown in FIG. 11. The relation between the focus shift and the degree of coincidence is decided by tabulating this relation or by fitting with a function. The results obtained by performing the same measurement three times are shown in FIG. 10. As is apparent from this figure, the relation between the focus shift and the degree of coincidence depending on difference in height of the sample is excellent in reproducibility.

At the time of photographing the tilted series images, if a focus shift is caused by tilting the sample, the degree of coincidence with the in-focus image is calculated, the amount of focus shift is calculated backwards from the relation between the focus shift and the degree of coincidence, and after the focus correction, the image is photographed.

Embodiment 2

In the present embodiment, description is given of a modified example of Embodiment 1 described above by focusing on differences from Embodiment 1.

Figure 12:
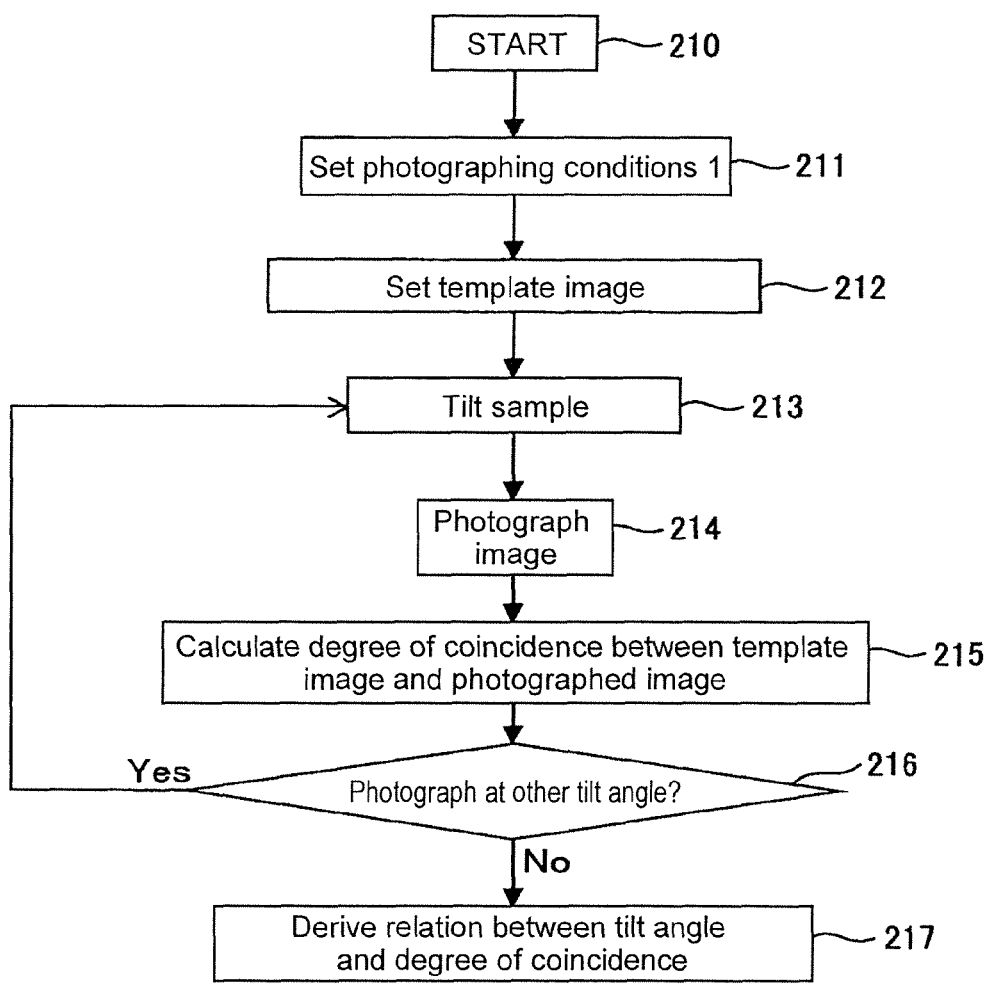
FIG. 12 is a flow chart showing Embodiment 2.

FIG. 12 is a flow chart showing the present embodiment.

First, photographing conditions 1 are set (211). Here, the tilt step angle is set more roughly than the tilt step angle which is set when an image necessary for three-dimensional reconstruction is acquired. Next, focusing is performed to photograph an image, and the region which becomes a template is set from the photographed image by an operator (212). After that, the sample is automatically tilted to photograph an image. The image correlation between the image after tilting and the template is obtained to calculate the degree of coincidence (215). At this time, means 2 for calculating a degree of coincidence is used. Next, the sample is tilted, and 213 to 218 are repeated the necessary number of times. After the photographing within a desired angle range has been ended, the relation between the tilt angle of the sample and the degree of coincidence is obtained (217). As described in Embodiment 1, the relation between the degree of coincidence and the height of the sample is decided, and hence a change amount of the height of the sample depending on the tilting of the sample can be associated on the basis of the degree of coincidence. In addition, in the case where the sample is eccentrically rotated, the relation between the tilt angle and the degree of coincidence can be approximated by a sine function of a 360-degree cycle. Accordingly, it is effective to fit the relation between the tilt angle and the degree of coincidence with a sine function. Further, the rotational motion can be approximated by a circular motion, and hence a change amount of the height (Z direction) of the sample is coincident with a change amount in the X direction of the photographed image. In the case where the relation between the tilt angle of the sample and the degree of coincidence is fitted with a sine function, the relation between the tilt angle of the sample and the amount of displacement in the X direction has a value shifted in phase by 90° with respect to the function obtained by fitting with a sine function. In this way, the disappearance from the field of view on the X-Y plane and the focus shift in the Z direction are expressed by given functions, respectively.

Figure 13:
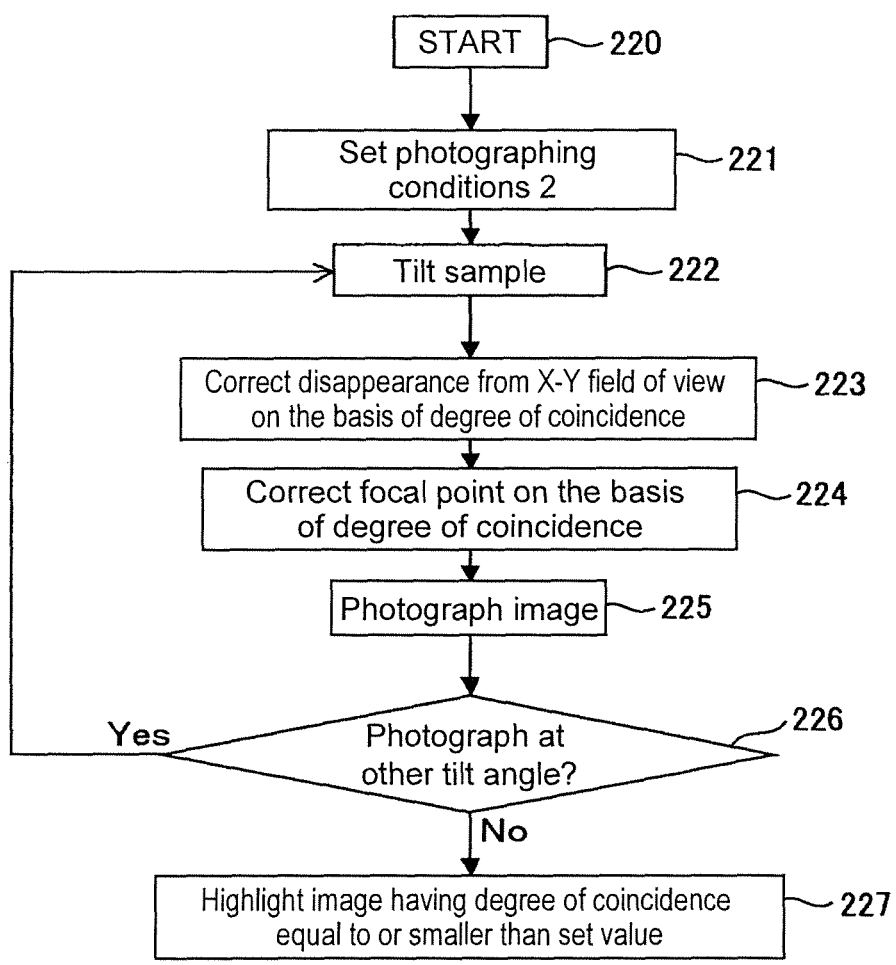
FIG. 13 is a flow chart showing Embodiment 2.

Next, with reference to FIG. 13, the flow of automatic photographing of tilted series images necessary for three-dimensional reconstruction is described. First, photographing conditions are set (221). At this time, the tilt step angle and the number of photographed images are set. The tilt step angle is set to approximately 1 to 5°, and the number of photographed images is set to approximately 37 to 181 in accordance with the step angle. After that, photographing is automatically started. When the sample is tilted, the disappearance from the field of view and the focus shift occur. However, as described above, the amount of displacement on the X-Y plane and the relation thereof in the Z direction have already been obtained on the basis of the degree of coincidence, and hence the stage or the charged particle beam is moved on the basis of this relation, to thereby correct the disappearance from the field of view (223) and correct the focus shift (224), so that the image is photographed. Next, the sample is tilted (222), and 222 to 226 are repeated. When the set number of images is photographed, the automatic take-in is ended. The tilted series images may include an image inappropriate for three-dimensional reconstruction. Therefore, the degree of coincidence with the image photographed in advance is obtained, and if the degree of coincidence is equal to or smaller than the set value, the corresponding image is highlight-displayed (227).

REFERENCE SIGNS LIST

1 microscope body
2, 100 electron gun
3 radiation lens
4, 23 objective lens
5 projection lens
6 scanning coil
7, 155 sample
8 sample holder
9 holder control unit
10, 24 secondary electron detector
11, 27 scanned image display device
12 circular ring-like detector
13 detector
14 TV camera
15 TV camera control unit
16 TV monitor
17 electron beam
31 holder shaft
32, 34, 38 bevel gear
33 sample rotating shaft
35 sample pedestal
36 minute sample piece
37 deposition film
102 first radiation lens coil
103 second radiation lens coil
104 first deflection coil
105 second deflection coil
106 objective lens coil
107 first electromagnetic coil for sample image movement
108 second electromagnetic coil for sample image movement
109 first intermediate lens coil
110 second intermediate lens coil
111 first projection lens coil
112 second projection lens coil
113 to 123 excitation power supply
124 to 134 DAC
135 microprocessor 136 storage device
137 arithmetic device
138 CRT controller
139 CRT
140, 141 I/F
142 magnification switching rotary encoder
143 input rotary encoder
144 keyboard
145 RAM
146 ROM
147 TV control unit
148 scintillator
149 TV
150 mouse
151 secondary electron detector
152 sample holder drive mechanism
160 electron beam
161 needle stage on sample mounting holder
162 micro sample
163 sample at rotation angle of 0°
164 sample at rotation angle of 90°
165 sample at rotation angle of 180°
166 sample rotating axis
170 template setting window
171 photographed image
180 to 189 flow at the time of photographing tilted series images of Embodiment 1
190 to 200 $0^{th}$ photographed image
201 $m^{th}$ photographed image
202 $(m+1)^{th}$ photographed image
210 to 217, 220 to 227 flow at the time of photographing tilted series images of Embodiment 2

The invention claimed is:

1. A charged particle beam apparatus for automatically photographing a series of tilted images, comprising:
a sample pedestal configured to rotatably hold a sample;
a radiation optical system configured to radiate a charged particle beam to the sample;
a detector configured to detect the charged particle beam after the charged particle beam is transmitted through the sample and secondary electrons which are generated from the sample by the charged particle beam, wherein the detector comprises a transmitted charged particle detector and a secondary charged particle detector;
a sample pedestal control device configured to control at east a rotation angle of the sample pedestal; and
an arithmetic device configured to control at least the radiation optical system or the sample pedestal control device,
wherein the arithmetic device is configured to:
form a secondary charged particle image based on an output of the detector,
form a template image based on the secondary charged particle image
calculate a degree of coincidence between the template image and tilted secondary charged particle images obtained after the sample is tilted by the sample pedestal control device,
perform a correction when the tilted secondary charged particle image disappears from a field of view, based on the calculated degree of coincidence,
perform a focal point correction by using a relation between an amount of focus shift, based on an image correction between an in-focus image and a defocused image, and the degree of coincidence, wherein the degree of coincidence is obtained prior to performing the focal point correction, and
form a transmitted charged particle image based on an output of the transmitted charged particle detector following the focal point correction.

2. The charged particle beam apparatus according to claim 1, wherein the arithmetic device includes:
a storage device configured to register image data of the template image; and
a camera configured to acquire the template image and the series of tilted images.

3. The charged particle beam apparatus according to claim 1, wherein the arithmetic device includes:
a monitor configured to highlight display an image having the degree of coincidence equal to or smaller than a threshold value, among the tilted series images.

4. The charged particle beam apparatus according to claim 1, wherein the arithmetic device is further configured to:
set a threshold value of the degree of coincidence; and
stop radiation of the charged particle beam to the sample after an image having the degree of coincidence equal to or smaller than the threshold value is photographed.

5. The charged particle beam apparatus according to claim 4, wherein the arithmetic device includes a monitor configured to display a warning when the radiation of the charged particle beam is stopped.

6. A charged particle beam apparatus for automatically photographing tilted series images, comprising:
a sample pedestal configured to rotatably hold a sample;
a radiation optical system configured to radiate a charged particle beam to the sample;
a detector configured to detect a charged particle beam which has been transmitted through the sample and secondary electrons which are generated from the sample by the charged particle beam, wherein the detector comprises a transmitted charged particle detector and a secondary charged particle detector;
a sample pedestal control device configured to control at least a rotation angle of the sample pedestal; and
an arithmetic device configured to control at least the radiation optical system or the sample pedestal control device, wherein the arithmetic device is configured to:
form a template image based on an output of the secondary charged particle detector,
calculate a degree of coincidence between the template image and a secondary charged particle image obtained after the sample is tilted by the sample pedestal control device,
perform a focal point correction by using a relation between an amount of focus shift, based on an image correction between an in-focus image and a defocused image, and the degree of coincidence, wherein the degree of coincidence is obtained prior to performing the focal point correction, and
form a transmitted charged particle image based on an output of the transmitted charged particle detector following the focal point correction.

7. The charged particle beam apparatus according to claim 6, wherein the arithmetic device includes:
a storage device configured to register image data of the template image; and
a camera configured to acquire the template image and the series of tilted images.

8. The charged particle beam apparatus according to claim 6, wherein the arithmetic device includes:
a monitor configured to highlight display an image having the degree of coincidence equal to or smaller than a threshold value, among the tilted series images.

9. The charged particle beam apparatus according to claim 6, wherein the arithmetic device is further configured to:
    set a threshold value of the degree of coincidence; and
    stop radiation of the charged particle beam to the sample after an image having the degree of coincidence equal to or smaller than the threshold value is photographed.

10. The charged particle beam apparatus according to claim 9, wherein the arithmetic device includes a monitor configured to display a warning when the radiation of the charged particle beam is stopped.

* * * * *